US012676611B2

(12) United States Patent
Ates Gurcan et al.

(10) Patent No.: US 12,676,611 B2
(45) Date of Patent: Jul. 7, 2026

(54) LOW-POWER MAGNETIC SENSING DEVICE AND MAGNETIC SWITCH DEVICE COMPRISING THE MAGNETIC SENSING DEVICE

(71) Applicant: Allegro MicroSystems, LLC, Manchester, NH (US)

(72) Inventors: Hakan Ates Gurcan, Los Gatos, CA (US); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 309 days.

(21) Appl. No.: 18/428,150

(22) Filed: Jan. 31, 2024

(65) Prior Publication Data

US 2025/0247095 A1     Jul. 31, 2025

(51) Int. Cl.
*H03K 17/95* (2006.01)
*G01R 33/09* (2006.01)
*H03K 17/687* (2006.01)

(52) U.S. Cl.
CPC ....... *H03K 17/9505* (2013.01); *G01R 33/098* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 3,863,153 A | 1/1975 | Eshraghian | |
| 4,196,391 A | 4/1980 | Weber | |
| 5,247,581 A | 9/1993 | Gurcan | |
| 5,291,139 A * | 3/1994 | Fruhauf | G11C 17/16 324/705 |

(Continued)

FOREIGN PATENT DOCUMENTS

| | | |
|---|---|---|
| EP | 0 019 827 A1 | 12/1980 |
| EP | 2 878 927 A1 | 6/2015 |

OTHER PUBLICATIONS

PCT International Search Report and Written Opinion dated Mar. 12, 2025 for International Application No. PCT/US2024/059292; 13 Pages.

(Continued)

*Primary Examiner* — Suman K Nath
(74) *Attorney, Agent, or Firm* — DALY, CROWLEY, MOFFORD & DURKEE, LLP

(57) ABSTRACT

Magnetic sensing device integrated in a magnetic switch device that makes or breaks contact in the presence of an external magnetic field, comprising: a first transistor biased at a first terminal by a first bias voltage and a first magnetoresistive element having a first resistance variable with the external magnetic field. At a reference field strength, the first resistance has a first reference resistance value, and the first bias voltage is adjustable to control a first current at the second terminal of the first transistor at a first reference current value. When the external magnetic field is varied around the reference field strength, the first variable resis- (Continued)

tance varies around the first reference resistance value by a resistance delta, such that the first current modulates around the first reference current value by a current delta. A magnetic switch device comprising the magnetic sensing device is also disclosed.

20 Claims, 11 Drawing Sheets

(56) References Cited

U.S. PATENT DOCUMENTS

| | | | |
|---|---|---|---|
| 5,493,218 | A | 2/1996 | Hayashi et al. |
| 5,619,137 | A | 4/1997 | Vig et al. |
| 6,084,406 | A | 7/2000 | James et al. |
| 6,194,896 | B1 | 2/2001 | Takahashi et al. |
| 6,229,299 | B1 | 5/2001 | Strashny |
| 6,297,627 | B1 | 10/2001 | Towne et al. |
| 6,356,741 | B1 | 3/2002 | Bilotti et al. |
| 6,424,182 | B1 | 7/2002 | Plagens |
| 6,473,255 | B2 | 10/2002 | Hatanaka et al. |
| 6,504,363 | B1 | 1/2003 | Dogaru et al. |
| 6,809,851 | B1 | 10/2004 | Gurcan |
| 6,861,839 | B2 | 3/2005 | Hara et al. |
| 6,940,629 | B2 | 9/2005 | Gurcan |
| 7,012,450 | B1 | 3/2006 | Oner et al. |
| 7,148,642 | B2 | 12/2006 | Brannen et al. |
| 7,268,526 | B1 | 9/2007 | Smith |
| 7,405,554 | B2 | 7/2008 | Yao |
| 7,755,349 | B2 | 7/2010 | James |
| 7,952,337 | B2 | 5/2011 | Gurcan |
| 8,008,908 | B2 | 8/2011 | Doogue et al. |
| 8,022,681 | B2 | 9/2011 | Gurcan |
| 8,222,888 | B2 | 7/2012 | David et al. |
| 8,294,441 | B2 | 10/2012 | Gurcan et al. |
| 8,304,931 | B2 | 11/2012 | Gurcan |
| 8,552,791 | B2 | 10/2013 | Sahin et al. |
| 8,604,763 | B2 | 12/2013 | Gurcan |
| 8,779,628 | B2 | 7/2014 | Gurcan |
| 9,443,905 | B1 | 9/2016 | Bandic et al. |
| 9,520,444 | B1 | 12/2016 | Bandic et al. |
| 9,673,387 | B2 | 6/2017 | Bandic et al. |
| 9,780,143 | B2 | 10/2017 | Bandic et al. |
| 10,157,656 | B2 | 12/2018 | Bandic et al. |
| 10,345,417 | B2 | 7/2019 | Geisler |
| 10,468,485 | B2 | 11/2019 | Chetlur et al. |
| 10,866,289 | B2 | 12/2020 | Cook |
| 11,397,863 | B2 | 7/2022 | Alaoui et al. |
| 11,468,250 | B2 | 10/2022 | Alaoui et al. |
| 11,624,799 | B2 | 4/2023 | Cesaretti et al. |
| 2001/0030537 | A1 | 10/2001 | Honkura et al. |
| 2004/0100251 | A1 | 5/2004 | Lohberg |
| 2004/0179257 | A1 | 9/2004 | Gurcan |
| 2005/0194964 | A1 | 9/2005 | Okada et al. |
| 2006/0006864 | A1 | 1/2006 | Johnson et al. |
| 2006/0071659 | A1 | 4/2006 | Tatschl et al. |
| 2006/0103547 | A1 | 5/2006 | Salser et al. |
| 2008/0090683 | A1 | 4/2008 | Englert et al. |
| 2008/0150368 | A1 | 6/2008 | Gurcan |
| 2008/0150500 | A1 | 6/2008 | Gurcan |
| 2008/0157740 | A1 | 7/2008 | Gurcan |
| 2008/0174289 | A1 | 7/2008 | Gurcan et al. |
| 2008/0315865 | A1 | 12/2008 | Doogue et al. |
| 2010/0052424 | A1 | 3/2010 | Taylor et al. |
| 2010/0079195 | A1 | 4/2010 | Sahin et al. |
| 2010/0237839 | A1 | 9/2010 | Gurcan |
| 2011/0074368 | A1 | 3/2011 | Gurcan |
| 2013/0271195 | A1 | 10/2013 | Gurcan |
| 2016/0363620 | A1 | 12/2016 | Choe et al. |
| 2017/0062034 | A1 | 3/2017 | Bandic et al. |
| 2017/0062519 | A1 | 3/2017 | Bandic et al. |
| 2017/0084827 | A1 | 3/2017 | Bandic et al. |
| 2017/0285117 | A1 | 10/2017 | Drouin et al. |
| 2019/0207562 | A1* | 7/2019 | Agrawal ............ H03F 3/45192 |
| 2023/0152393 | A1 | 5/2023 | Haas et al. |
| 2023/0390110 | A1 | 12/2023 | Padovani et al. |

OTHER PUBLICATIONS

U.S. Appl. No. 18/260,151, filed Jun. 30, 2023, Serrano Guisan et al.

Allegro Microsystems, Inc., "Micropower, Ultra-sensitive Hall-effect Switches," A3211, A3212 Datasheet, 3211-DS, Rev. 5; 2002, 2007, 12 pages.

Allegro Microsystems, Inc., "Hall-Effect Direction Detection Sensors ICs," Press Release from Oct. 1997; 1 Page.

Allegro Microsystems, Inc., "Hall-Effect, Direction-Detection Sensors," 3422 Datasheet; May 1, 2007; 10 Pages.

Diodes Incorporated, "Micropower, Ultra-Sensitive Hall Effect Switch," AH1884 Datasheet, Rev. 3; Jul. 2007, 7 pages.

Diodes Incorporated, "Micropower Omnipolar Hall-Effect Sensor Switch," AH180 Datasheet, Rev. 5; Feb. 2007; 9 Pages.

E-CMOS, "CMOS High Sensitivity Micropower Hall-Effect Switch," EC2648-BL Datasheet; Feb. 28, 2006; 5 Pages.

ELMOS Semiconductor AG, "Ultra Low Power HALL-Sensor," E910.44 Datasheet/Specification; Sep. 27, 2006; 5 Pages.

Infineon Technologies, "Low Power Hall Switch," TLE 4917 Datasheet; Edition Aug. 22, 2008; 13 Pages.

IXYS, "µPower Hall-Effect Switch," MX887P Datasheet; Drawing No. 088709; Jul. 19, 2007; 4 Pages.

Panasonic, "Low current consumption, high sensitivity CMOS Hall IC Alternating magnetic field operation (For low-speed rotation detection)," AN48840B, AN48841B Datasheet; Published Oct. 2006; 5 Pages.

Rohm, BU52001GUL Datasheet, Rev. D; Structure: Silicon Monolithic Integrated Circuit; Product Series: Hall Effect Switch; Apr. 18, 2005, 6 Pages.

Toko, "Hall Sensor IC," TK60011DS8/MC; Application Manual, Retrieved Jan. 21, 2008; 12 Pages.

* cited by examiner

LOW-POWER MAGNETIC SENSING DEVICE AND MAGNETIC SWITCH DEVICE COMPRISING THE MAGNETIC SENSING DEVICE

FIELD

The present disclosure relates generally to magnetic sensing devices and magnetic switch devices. In particular, the present disclosure relates to a magnetic sensing device and a magnetic switch device comprising the magnetic sensing device and having very low power consumption.

BACKGROUND

Magnetic field sensors based on tunnel magnetoresistive (TMR) elements, composed of one or multiple ferromagnetic tunnel magnetoresistive junctions (MTJs) offer high sensitivity and low noise. While many TMR elements allow the construction of magnetic switch devices with moderate or low current consumption compared to competing technologies, there are applications where this current consumption is still too high. In particular, for portable applications with long shelf life, such as medical packaging, the proper operation of the magnetic switch depends on being able to extend the device's usable battery life as much as possible, while maintaining adequate response time.

As is known, magnetic switch devices are used to detect proximity of a target to one or more magnetic field sensing devices of the switch, where target and switch are capable of motion relative to one another. Example devices may include a stationary portion to which the switch is attached and a movable portion including a magnet, such as cellular telephones and laptop computers having magnets in moveable door or cover portions.

The standard method to reduce consumption for an "always on" switch is to use a "duty-cycle" approach, which severely reduces the maximum detection speed and makes the sensor insensitive to transient events.

SUMMARY

The present disclosure concerns a magnetic sensing device configured for integration in a magnetic switch device, the magnetic sensing device comprising at least one TMR element having a TMR resistance that varies with the external magnetic field; said least one TMR element being coupled to a first power supply rail providing a supply voltage substantially independent of the external magnetic field; and said least one TMR element being further coupled to a third terminal of a first transistor, the first transistor being biased at a first terminal by a first bias voltage. At a reference field strength of the external magnetic field, the TMR resistance has a TMR reference resistance value, and the first bias voltage is adjustable to control a first current at a second terminal of the first transistor at a first reference current value. Said at least one TMR element is configured such that, when the external magnetic field is varied around the reference field strength, the TMR resistance varies around the TMR reference resistance value by a resistance delta, such that the first current modulates around the first reference current value by a current delta.

The present disclosure further concerns a magnetic switch device configured to generate two distinct logic levels in response to a sensed magnetic field strength, the magnetic switch device comprising the magnetic sensing device.

The magnetic switch device further comprises a second transistor biased at a first terminal of the second transistor by a second bias voltage, a second terminal of the second transistor being connected to the second terminal of the first transistor at a node. The second bias voltage is adjustable to control a second current at the second terminal of the second transistor such that the second current is substantially equal to the first reference current value of the first transistor.

The magnetic switch device configured as described in the present invention allows for generating two distinct logic levels in response to a sensed magnetic field strength using very low energy levels.

The magnetic switch device has ultra-low nano-Ampere (nA)-level current consumption, which allows to significantly extend the usable battery life and thus shelf life of a portable product device, while providing continuous monitoring and therefore high detection speed and near-instantaneous response time.

In contrast with known solutions, the magnetic switch device disclosed herein uses a TMR element directly as the source degeneration resistor in a common-gate configuration. This provides the advantage of achieving very low power, without the need for any duty-cycle technique and thus achieving real-time fast response. Other advantages of the magnetic sensing device include very small die size and its suitability for ultra-low-power (ULP) implementation. The magnetic switch device incorporating the magnetic sensing device can function as an always-on circuit.

BRIEF DESCRIPTION

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

Figure 9:
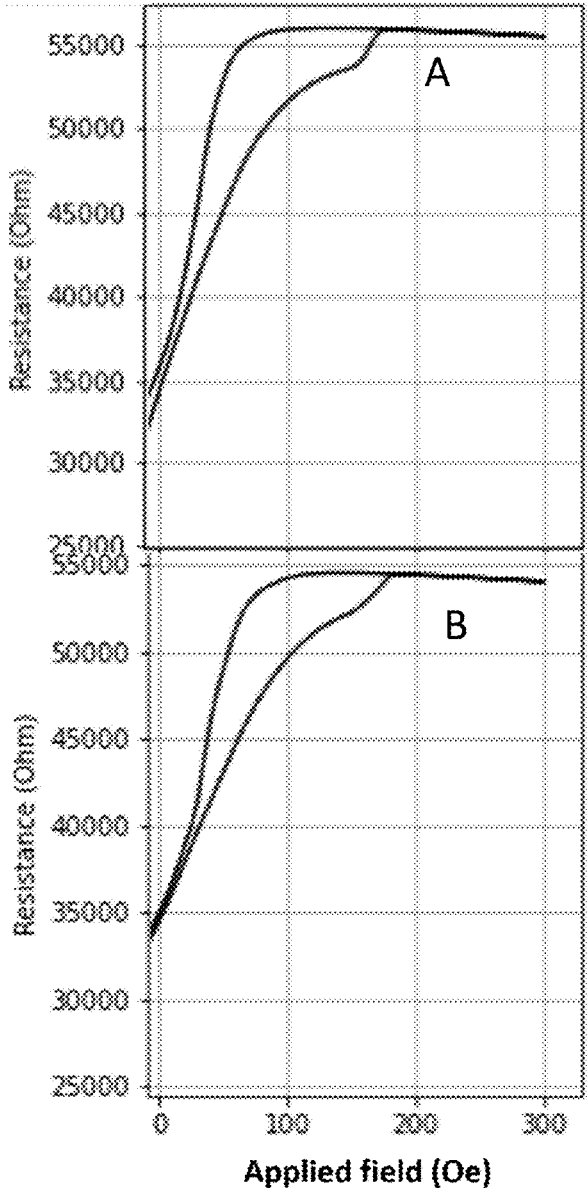
Figures 10A, 10B:
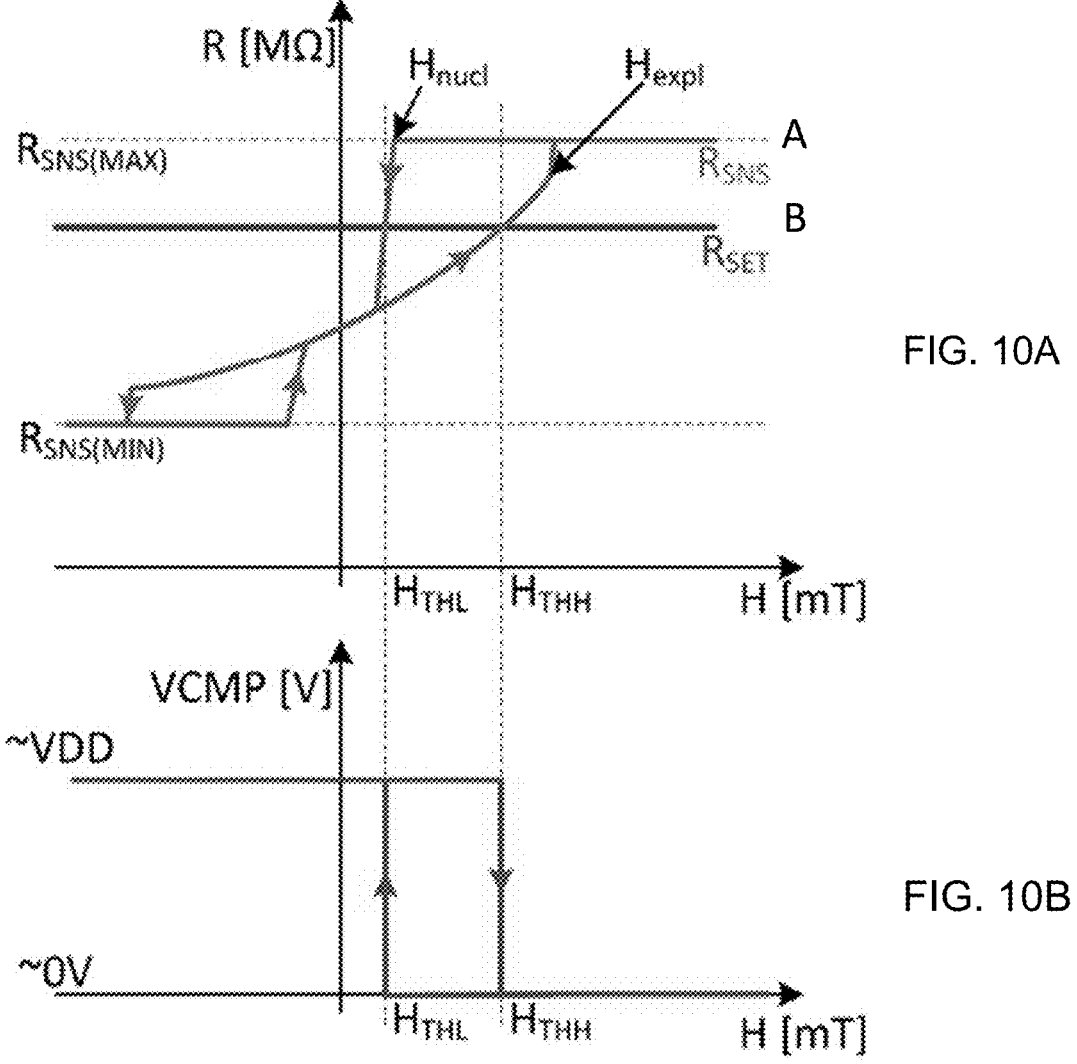
Figure 11:
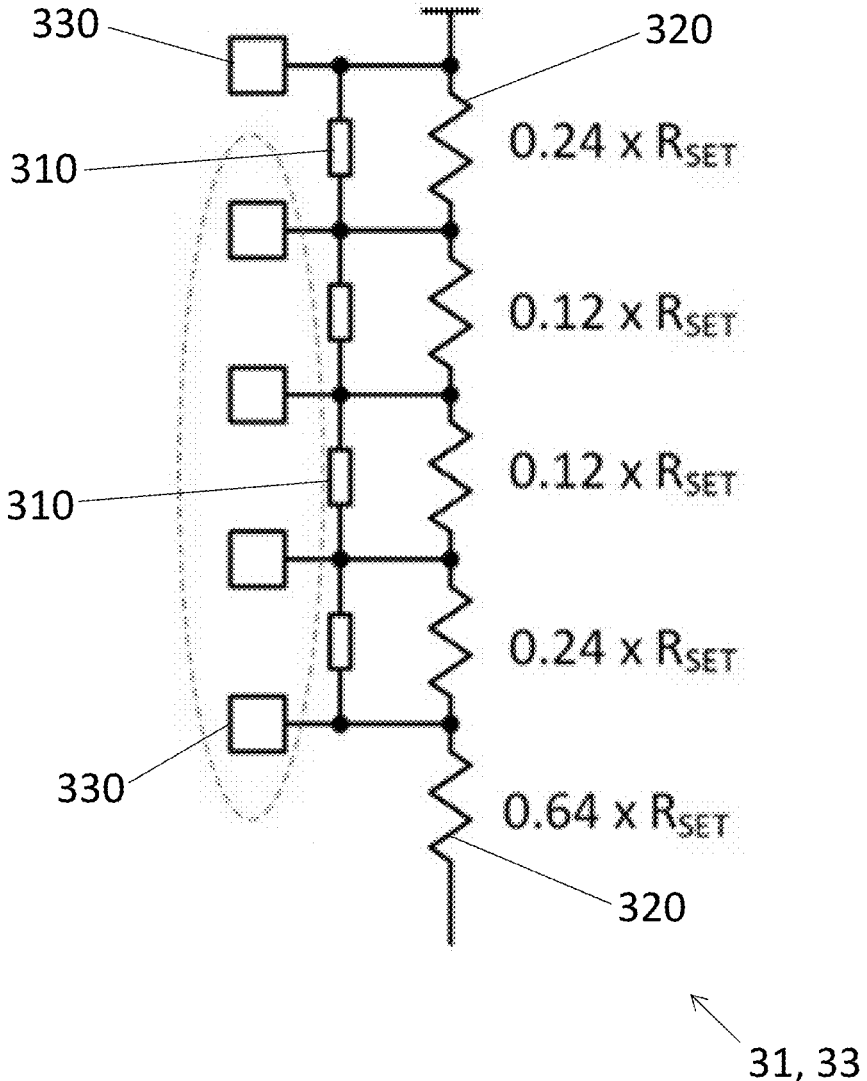
Figure 12:
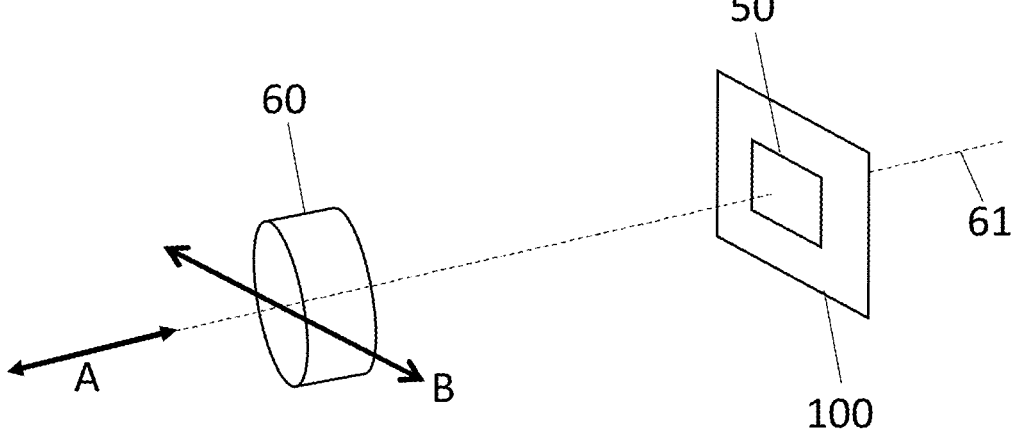

FIG. 9 reports resistance of the TMR element as a function of the magnitude of an external magnetic field for the TMR element comprising a plurality of MTJs;

FIG. 10a reports the resistance for the TMR element (curve A) and the adjustable setting resistance for the setting resistance element (curve B), as a function of the magnitude of the external magnetic field;

FIG. 10$b$ reports the variation of an output voltage of the magnetic sensing device as a function of the external magnetic field;

FIG. 11 illustrates a possible configuration of the adjustable setting resistance; and FIG. 12 illustrates a magnetic switch device comprising the magnetic sensing device, according to an embodiment.

DETAILED DESCRIPTION

Figure 1:
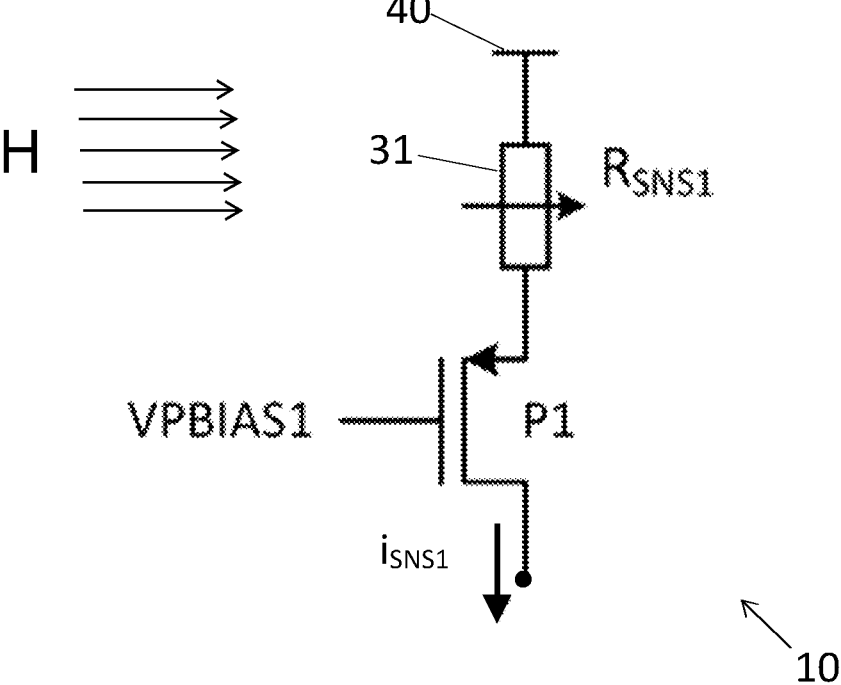
FIG. 1 shows a magnetic field sensing device comprising a TMR element, according to an embodiment.

FIG. 1 shows a magnetic sensing device 10 configured to be integrated in a magnetic switch, according to an embodiment. The magnetic sensing device 10 comprises a first transistor P1 and a first TMR element 31 coupled to a first power supply rail 40 providing a supply voltage substantially independent of the external magnetic field to the first TMR element 31. The first TMR element 31 is further coupled to a third terminal of the first transistor P1. The first TMR element 31 is configured to generate a magnetic field signal in response to an external magnetic field. In other words, the first TMR element 31 has a first TMR resistance $R_{SNS1}$ that is variable with the external magnetic field. The first transistor P1 is biased at a first terminal by a first bias voltage $V_{PBIAS1}$.

At a reference field strength $H_0$ of the external magnetic field, the first TMR resistance $R_{SNS1}$ of the first TMR element 31 has a first TMR reference resistance value $R_{SNS1}0$. At a reference field strength $H_0$, the first bias voltage $V_{PBIAS1}$ at the first terminal of the first transistor P1 can be adjusted to control a first current $i_{SNS1}$ at the second terminal of the first transistor P1 at a first reference current value $i_{SNS1}0$.

When the external magnetic field is varied around the reference field strength $H_0$ by a field strength delta $\Delta h$, the first TMR resistance $R_{SNS1}$ varies around the first TMR reference resistance value $R_{SNS1}0$ by a resistance delta $\Delta R_{SNS}$. The first current $i_{SNS1}$ is then modulated around the first reference current value $i_{SNS1}0$ by a current delta $\Delta i_{SNS}$. Thus, the sensitivity of the first TMR element 31 corresponds to the ratio of the resistance delta to the field strength delta $\Delta R_{SNS}/\Delta h$. The first bias voltage $V_{PBIAS1}$ does not vary with the varying external magnetic field.

In the configuration of FIG. 1, the first TMR element 31 is used as a source degeneration resistor, whose value changes in response to the varying external magnetic field and modulates the first current $i_{SNS1}$.

Figure 2:
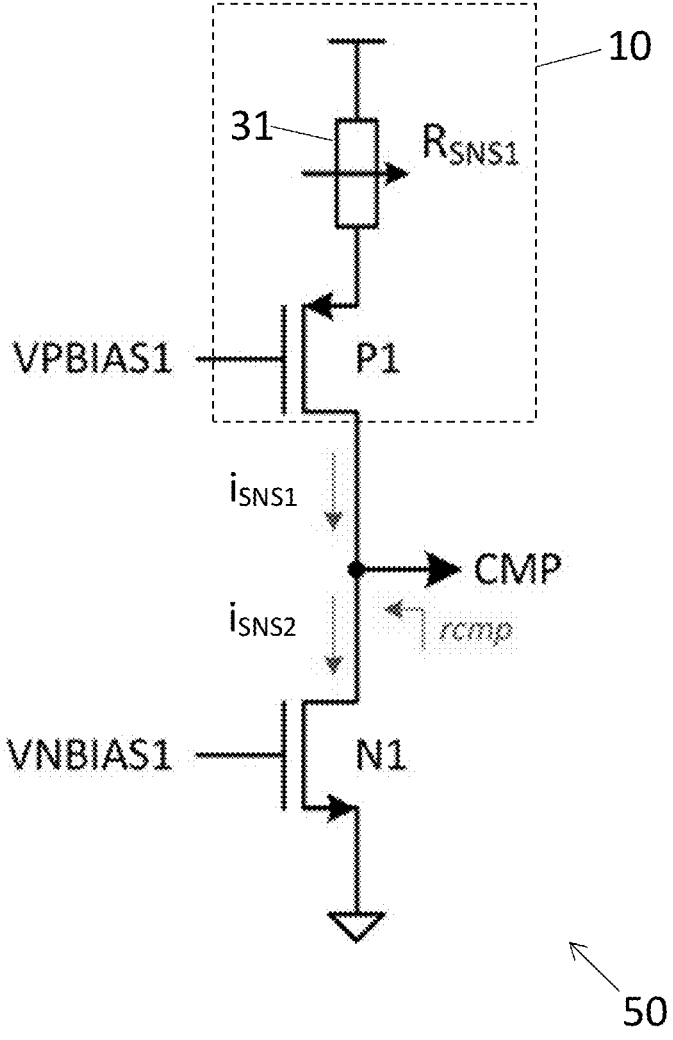
FIG. 2 shows the magnetic switch device, comprising the magnetic field sensing device.

FIG. 2 shows a magnetic switch device 50 which comprises the magnetic sensing device 10, according to another exemplary embodiment. The magnetic switch device 50 further comprises a second transistor N1. A second terminal of the second transistor N1 is connected to the second terminal of the first transistor P1. The second transistor N1 is biased at its first terminal by a second bias voltage $V_{NBIAS1}$. The second bias voltage $V_{NBIAS1}$ at the first terminal of the second transistor N1 can be adjusted to control a second current $i_{SNS2}$ at the second terminal of the second transistor N1 such that the second current $i_{SNS2}$ is substantially equal to the first reference current value $i_{SNS1}0$ of the first transistor P1.

The node CMP between the first and second transistor P1, N1 is characterized by a high impedance as is formed by the second terminals of first and second transistors P1, N1. In FIG. 2, the equivalent output impedance at the node CMP is represented by $r_{cmp}$.

When the external magnetic field is varied around the reference field strength $H_0$ by a field strength delta $\Delta h$, the first TMR resistance $R_{SNS1}$ varies around the first TMR reference resistance value $R_{SNS1}0$ by a resistance delta $\Delta R_{SNS}$. Since the first bias voltage $V_{PBIAS1}$ is constant (e.g., independent of magnetic field strength), the first current $i_{SNS1}$ is modulated around the first reference current value $i_{SNS1}0$ by a first current delta $\Delta i_{SNS1}$. The second current $i_{SNS2}$ is substantially equal to the first reference current value $i_{SNS1}0$. Consequently, the first current delta $\Delta i_{SNS1}$ at the high-impedance node CMP develops a large output voltage at node CMP. The output voltage is substantially equal to the first current delta $\Delta i_{SNS1}$ multiplied by the equivalent output impedance $r_{cmp}$ at the node CMP. Depending on the polarity of the field strength delta $\Delta h$, the node voltage $V_{cmp}$ at the node CMP moves towards one of the two voltage levels (positive or negative supply rails), representing two logic levels.

In one aspect, the magnetic switch device 50 of FIG. 2 further comprises a resistor (not shown) between the third terminal of the second transistor N1 and the ground supply rail. The resistor can improve the output impedance of the second transistor N1, which in turn will increase the equivalent output impedance $r_{cmp}$ and thus, the node voltage $V_{cmp}$.

Figure 3:
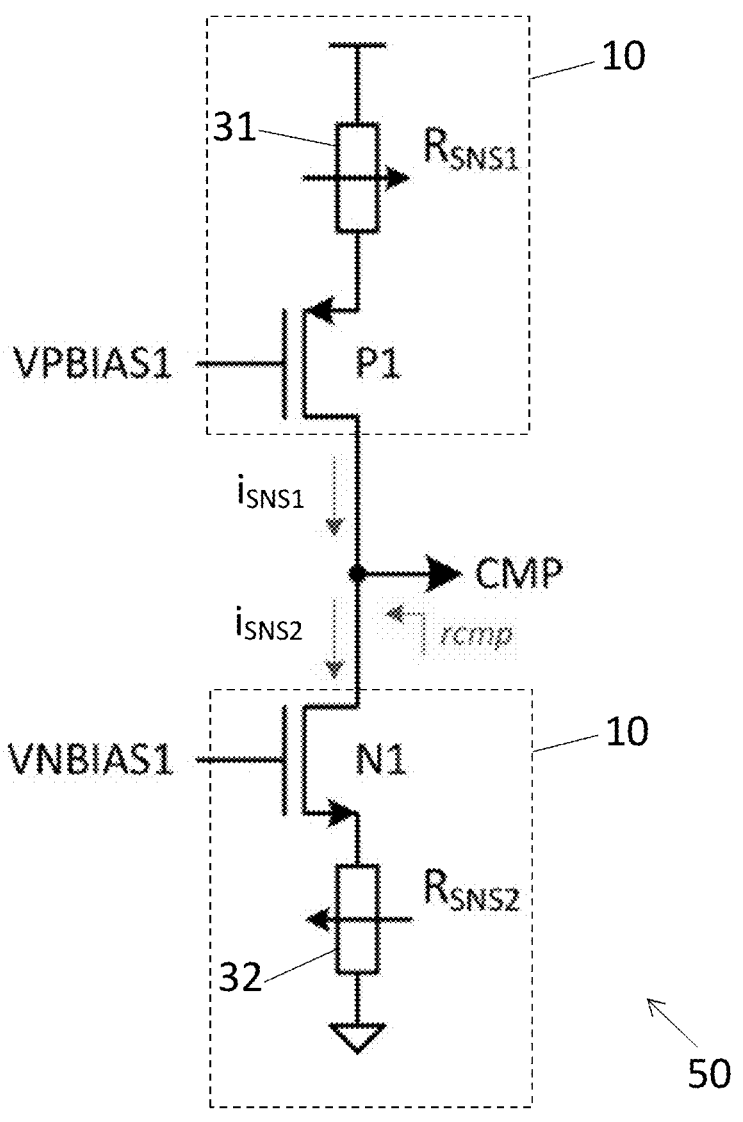
FIG. 3 shows the magnetic switch device, according to yet another embodiment.

FIG. 3 shows a variant of the magnetic switch device 50 shown in FIG. 2, further comprising another magnetic sensing device 10 including a second TMR element 32 having a second TMR resistance $R_{SNS2}$ and connected to the third terminal of the second transistor N1. The second TMR element 32 is configured to generate a magnetic field signal in response to an external magnetic field. In other words, the second TMR element 32 has a second TMR resistance $R_{SNS2}$ that is variable with the external magnetic field.

At the reference field strength $H_0$ of the of the external magnetic field, the second TMR resistance $R_{SNS2}$ has a second TMR reference resistance value $R_{SNS2}0$ and the second bias voltage $V_{PBIAS2}$ is adjustable to control the second current $i_{SNS2}$ at the second terminal of the second transistor P1 at a second reference current value $i_{SNS2}0$.

When the external magnetic field is varied around the reference field strength $H_0$, the second TMR resistance $R_{SNS2}$ varies around the second TMR reference resistance value $R_{SNS2}0$ by a second resistance delta $\Delta_{RSNS2}$. The second current $i_{SNS2}$ is modulated around the second reference current value $i_{SNS2}0$ by a second current delta $\Delta_{iSNS2}$.

The second bias voltage $V_{NBIAS1}$ at the first terminal of the second transistor N1 can be adjusted to control the second current $i_{SNS2}$ at the second terminal of the second transistor N1, such that the second current $i_{SNS2}$ is substantially equal to the first current $i_{SNS1}$ controlled by the first transistor P1.

In one aspect, the first and second TMR elements 31, 32 can be programmed to be sensitive to the external magnetic field in opposite directions. In other words, the first TMR resistance $R_{SNS1}$ of the first TMR element 31 increases with the increasing external magnetic field and the second TMR resistance $R_{SNS2}$ of the second TMR element 32 decreases with the decreasing external magnetic field, or vice-versa.

In such configuration, when the external magnetic field varies around the field strength reference value $H_0$ by a field strength delta $\Delta h$, the second TMR resistance $R_{SNS2}$ varies around the second TMR reference resistance value $R_{SNS2}0$ by a resistance delta $\Delta R_{SNS2}$ having a polarity opposed to the one of the resistance delta $\Delta R_{SNS1}$ of the first TMR resistance $R_{SNS1}$. More generally, a variation in the external magnetic field around the field strength reference value $H_0$ by a field strength delta $\Delta h$ results in the first TMR resistance $R_{SNS1}$ of the first TMR element 31 to vary around the first TMR reference resistance value $R_{SNS1}0$ by a positive (or negative) resistance delta $\Delta R_{SNS1}$. The second TMR resistance $R_{SNS2}$ of the second TMR element 32 varies around the second TMR reference resistance value $R_{SNS2}0$ by a negative (or positive) resistance delta $\Delta R_{SNS2}$.

Since the first and second bias voltages $V_{PBIAS1}$, $V_{PBIAS2}$ are constant (e.g., independent of magnetic field strength), the first current $i_{SNS1}$ is modulated by a positive (or negative) first current delta $+\Delta i_{SNS1}$ ($-\Delta i_{SNS1}$) and the second current $i_{SNS2}$ of the second transistor N1 is modulated by a negative (or positive) second current delta $-\Delta i_{SNS2}$ ($+\Delta i_{SNS2}$). At the node CMP, the output voltage $V_{out}$ corresponds to the difference of the values of the first and second current deltas $\Delta i_{SNS1}$ and $\Delta i_{SNS2}$, around the first and second currents $i_{SNS1}$, $i_{SNS2}$, multiplied by an equivalent output impedance $r_{cmp}$. If the first current delta $\Delta i_{SNS1}$ around the first current $i_{SNS1}$ is equal to the second current delta $\Delta i_{SNS2}$ around the second current $i_{SNS2}$, the output voltage $V_{out}$ corresponds to twice the current delta $\Delta i_{SNS}$ ($V_{out}=2*\Delta i_{sns}*r_{cmp}$) at the high-impedance node CMP, where $\Delta i_{SNS}=\Delta i_{SNS1}=\Delta i_{SNS2}$.

Depending on the polarity of the external magnetic field variation, the node voltage $\Delta V_{cmp}$ at the node CMP moves towards one of the two voltage levels (positive or negative supply rails), representing two logic levels.

The configuration of FIG. 3 allows increasing the sensitivity of the magnetic switch device 50 by a factor of about two, in the case the first and second TMR resistances $R_{SNS1}$, $R_{SNS2}$ have substantially the same sensitivity $\Delta R_{SNS}/\Delta h$ with opposite polarity.

In some other embodiments, the first and/or second transistor P1, N1 can be cascoded to increase its output impedance.

Figure 4:
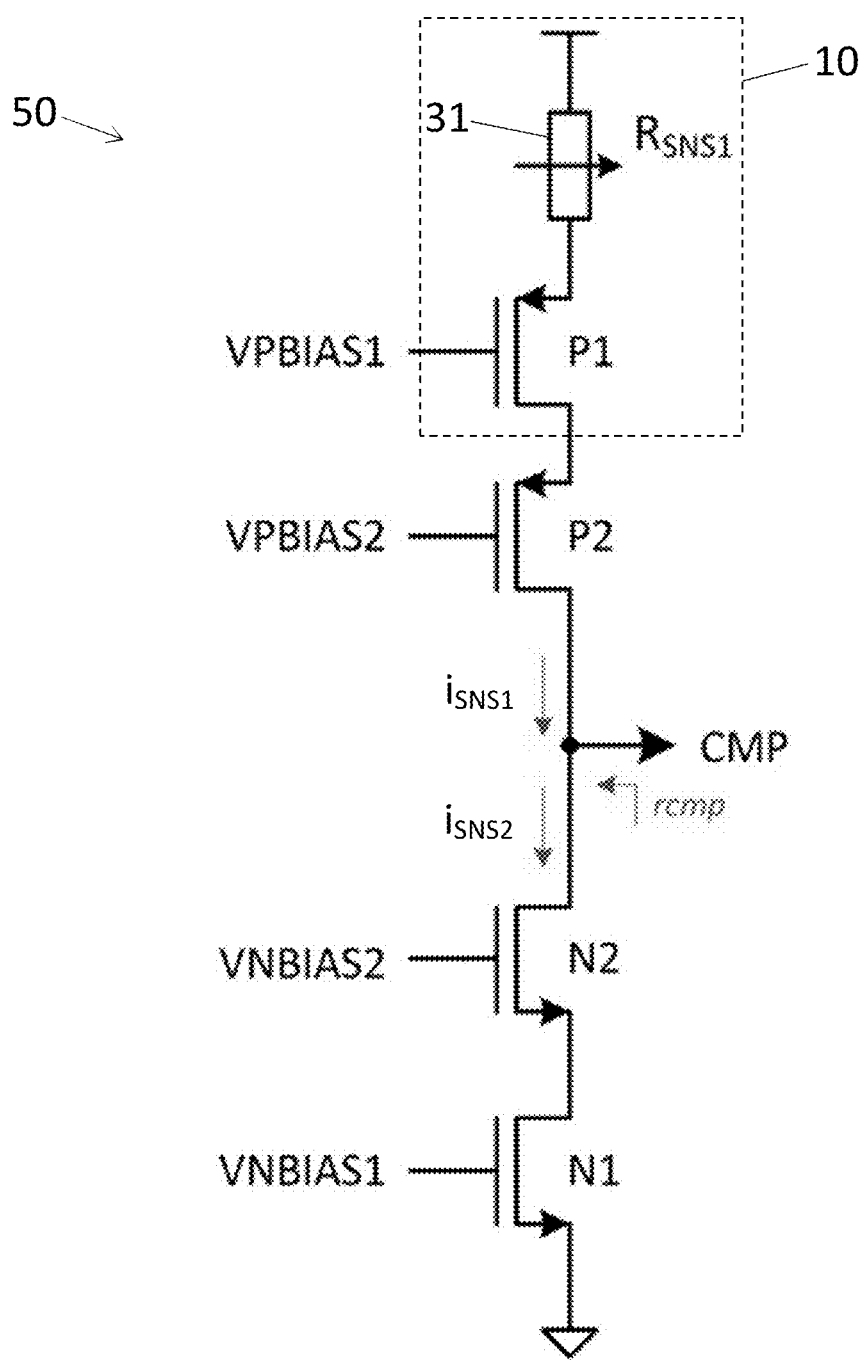
FIG. 4 shows the magnetic switch device, according to yet another embodiment.

FIG. 4 shows the magnetic switch device 50, according to another exemplary embodiment. More particularly, the magnetic switch device 50 corresponds to the configuration of the magnetic switch device 50 shown in FIG. 2 where a first cascode transistor P2 is connected to the first transistor P1 of the first sensing device 10, and a second cascode transistor N2 is connected to the second transistor N1. The first cascode transistor P2 is biased by a first cascode bias voltage $V_{PBIAS2}$ and the second cascode transistor N2 is biased by a second cascode bias voltage $V_{NBIAS2}$. The first and second cascode bias voltages $V_{PBIAS2}$, $V_{NBIAS2}$ can be substantially constant gate bias voltages (independent of the external magnetic field strength).

The additional first and second cascode transistors P2, N2 allows for increasing the equivalent output impedance $r_{cmp}$ at the node CMP.

Figure 5:
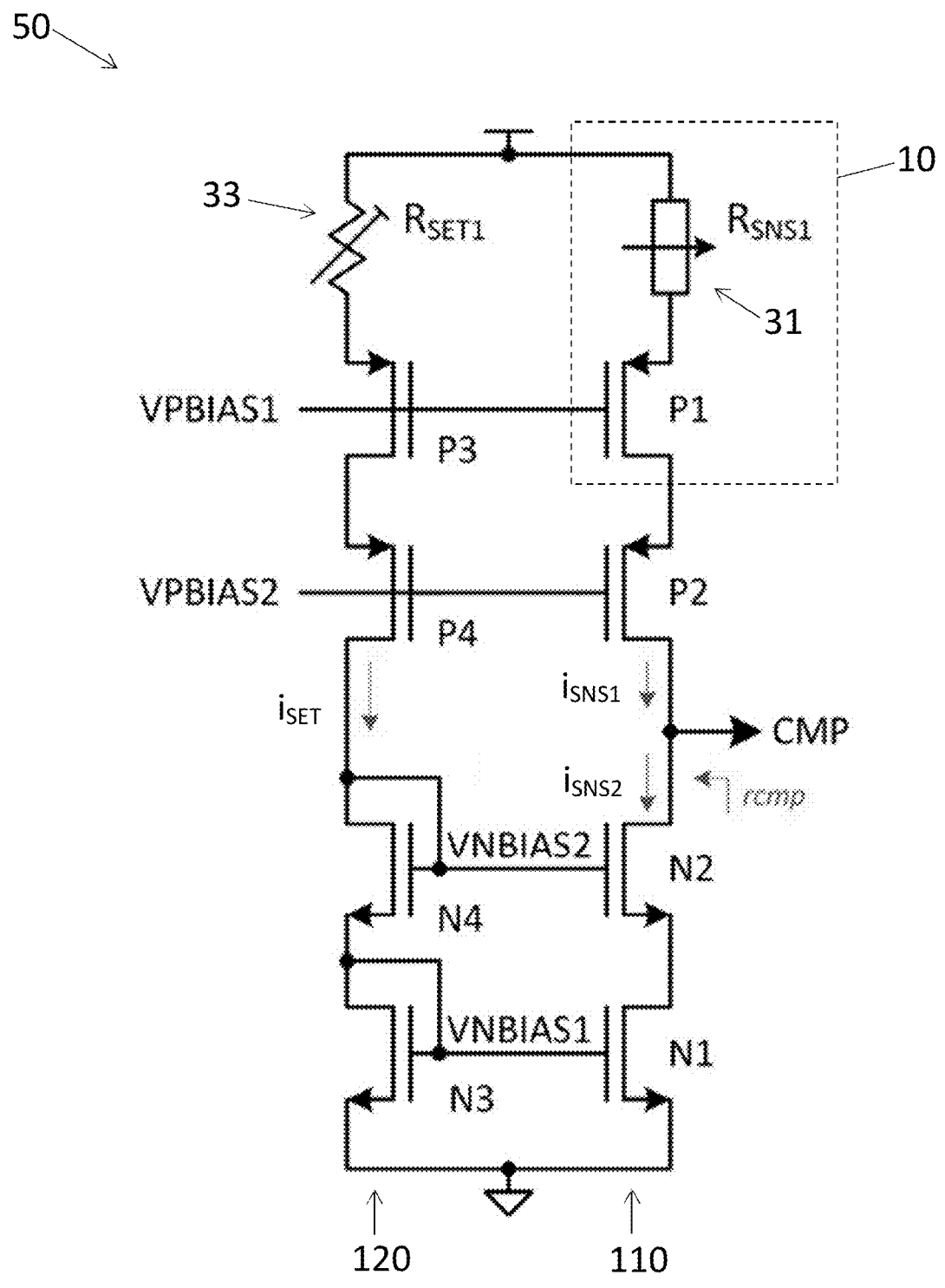
FIG. 5 shows the magnetic switch device comprising a TMR element and an adjustable setting resistance, according to an embodiment.

FIG. 5 shows the magnetic switch device 50, according to yet another exemplary embodiment using a turnaround current mirror circuit. The magnetic switch device 50 comprises a first branch 110 including the element forming the magnetic switch device configuration shown in FIG. 4, namely, the first sensing device 10 including the first TMR element 31 and first transistor P1, the first cascode transistor P2, second cascode transistor N2, and second transistor N1. The first and second transistors P1, N1 are biased at a first terminal by the first and second bias voltages $V_{PBIAS1}$, $V_{NBIAS1}$, respectively. The first and second cascode transistors P2, N2 are biased at a first terminal by the first and second cascode bias voltages $V_{PBIAS2}$, $V_{NBIAS2}$, respectively. The magnetic switch device 50 further comprises a second branch 120. The second branch 120 includes a first setting resistance element 33 connected to a third transistor P3 and a third cascode transistor P4. The third cascode transistor P4 is connected to a fourth cascode transistor N4 and a fourth transistor N3. The first and third transistors P1, P3 are biased by the first bias voltage $V_{PBIAS1}$. The first and third cascode transistors P2, P4 are biased at a first terminal by the first cascode bias voltage $V_{PBIAS2}$. The second and fourth cascode transistors N2, N4 are biased at a first terminal by the second cascode bias voltage $V_{NBIAS2}$. The second and fourth transistors N1, N3 are biased by the second bias voltage $V_{NBIAS1}$.

At a reference field strength $H_0$, the first and second bias voltages $V_{PBIAS1}$, $V_{PBIAS2}$ at the first terminal of the, respectively, first transistor P1 and first cascode transistor P2 can be adjusted to control the first current $i_{SNS1}$ at the second terminal of the transistors P1 and P2 at a first reference current value $i_{SNS1}0$.

In one aspect, the first setting resistance element 33 is configured to have a first adjustable resistance $R_{SET1}$. The first setting resistance element 33 can be configured such that the first adjustable resistance $R_{SET1}$ matches the first resistance $R_{SNS1}$ of the first TMR element 31 and such that the second current $i_{SNS2}$ controlled by the second transistor N1 and of the second cascode transistor N2 is substantially equal to the first current $i_{SNS1}$ controlled by the first transistor P1 and of the first cascode transistor P2. The transistors P3, P4, N3, N4 control a setting current $i_{SET}$ in the second branch 120.

The magnetic switch device 50 of FIG. 5 allows for generating the second bias voltage $V_{NBIAS1}$ and the second cascode bias voltage $V_{NBIAS2}$ while setting the second current $i_{SNS2}$ substantially equal to the first current $i_{SNS1}$, using a turnaround current mirror formed by the transistors N1-N4.

Figure 6:
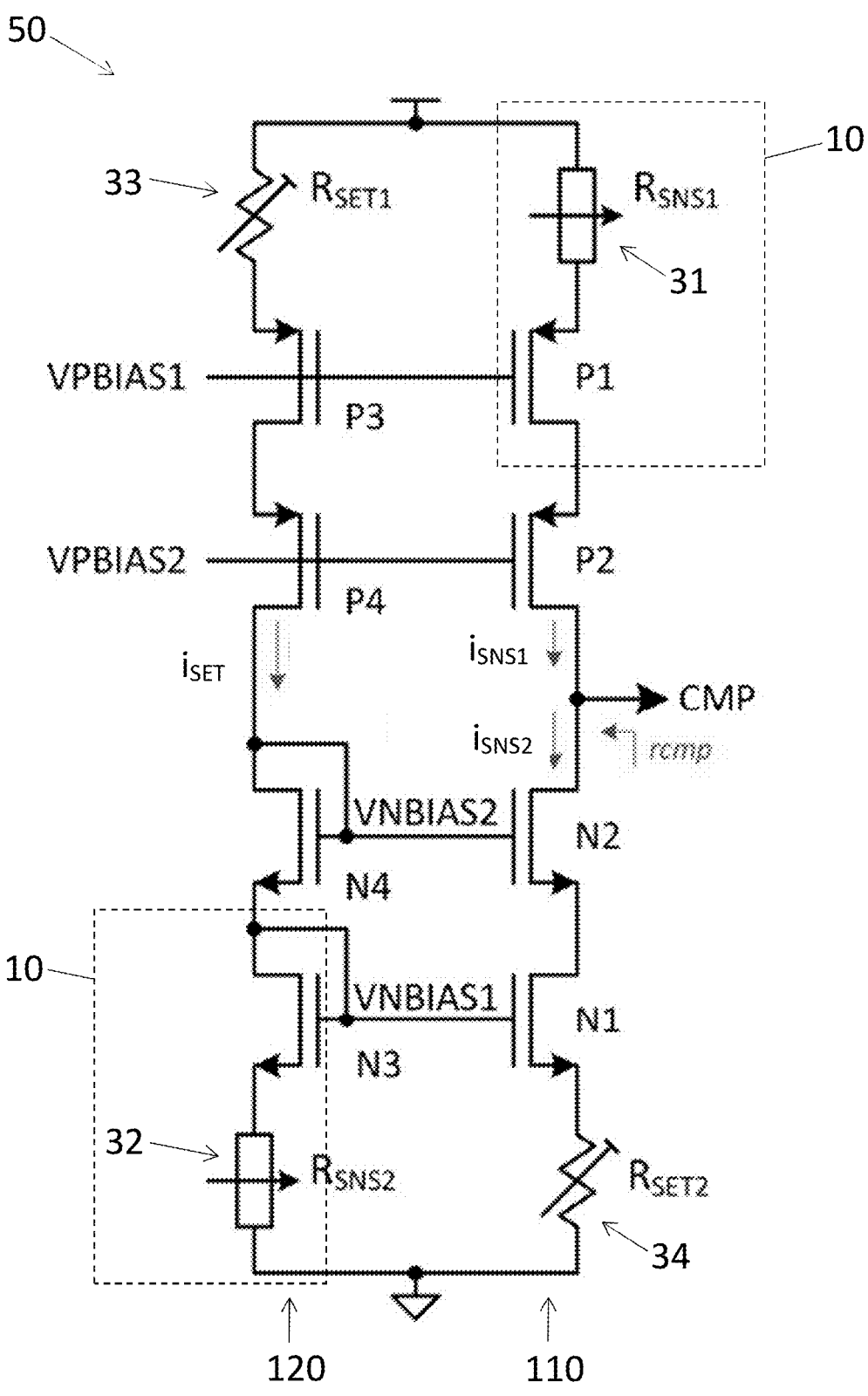
FIG. 6 shows a variant of the magnetic switch device of FIG. 5.

FIG. 6 shows the magnetic switch device 50, according to a preferred embodiment. Here, the circuit of the magnetic switch device 50 corresponds to the one shown in FIG. 5 where the second branch 120 further comprises a second TMR element 32 connected the fourth transistor N3, and where the first branch 110 further comprises a second setting resistance element 34 connected the second transistor N1. The second setting resistance element 34 has a second adjustable setting resistance $R_{SET2}$.

The magnetic switch device 50 of FIG. 6 has a sensitivity that is increased by at least two times compared to the configurations of the magnetic switch device 50 shown in FIG. 5.

In an embodiment, the first and second setting resistance element 33, 34 can comprise a trimmable resistance element. The resistance value of the first and second setting resistance element 33, 34 can then be adjusted by trimming.

The first and second setting resistance elements 33, 34 can be adjusted such that the respective first and second adjustable resistances $R_{SET1}$, $R_{SET2}$ have substantially the same value. It should be noted that the first and second setting resistance elements 33, 34 can be adjusted such that the values of the respective first and second adjustable resistances $R_{SET1}$, $R_{SET2}$ differ by less than ±1%, or less than ±2%, or less than ±5%. The transistors P3, P4, N3, N4 control a setting current $i_{SET}$ in the second branch 120.

In another aspect, each of the first and second setting resistance elements 33, 34 can comprise a TMR element which can be programmed to be sensitive to opposite polarity of the external magnetic field. In this configuration, the magnetic sensing device 10 can show an increase in its sensitivity of about four time, compared to the sensitivity of the magnetic sensing device 10 of FIG. 5.

In yet another aspect, the first setting resistance element 33 can be adjusted to have a resistance value that corresponds substantially to the first TMR reference resistance value $R_{SNS1}0$ of the first TMR element 31 at reference field strength $H_0$. Similarly, the second setting resistance element 34 can be adjusted to have a resistance value that corresponds substantially to the second TMR reference resistance value $R_{SNS2}0$ of the second TMR element 32 at reference field strength $H_0$.

In yet another aspect, the first setting resistance element 33 can be adjusted to have a resistance value substantially identical to the second setting resistance element 34.

In the configurations shown in FIGS. 1 to 6, the first transistor P1, the first cascode transistor P2, the third transistor P3, and the third cascode transistor P4 comprise a MOSFET transistor of PMOS type or a BJT transistor of PNP type. In the PMOS case, the first terminal corresponds to the gate of the transistor and the second terminal corresponds to the drain of the transistor and the third terminal corresponds to the source of the transistor. In the PNP case, the first terminal corresponds to the base of the transistor and the second terminal corresponds to the collector of the transistor, and the third terminal corresponds to the emitter of the transistor.

Similarly, in the configurations shown in FIGS. 1 to 6, the second transistor N1, the second cascode transistor N2, the fourth transistor N3, and the fourth cascode transistor N4 comprise a MOSFET transistor of NMOS type or a BJT transistor of NPN type. In the NMOS case, the first terminal corresponds to the gate of the transistor and the second terminal corresponds to the drain of the transistor and the third terminal corresponds to the source of the transistor. In the NPN case, the first terminal corresponds to the base of the transistor and the second terminal corresponds to the collector of the transistor, and the third terminal corresponds to the emitter of the transistor.

Other configurations of the magnetic switch device 50 can be contemplated. For example, any one of the first transistor P1, the first cascode transistor P2, the third transistor P3, and/or the third cascode transistor P4 can comprise any one of a MOSFET transistor of PMOS type or a BJT transistor of PNP type. Similarly, any one of the second transistor N1, the second cascode transistor N2, the fourth transistor N3, and/or the fourth cascode transistor P4 can comprise any one of a MOSFET transistor of NMOS type or a BJT transistor of NPN type.

Other configurations of the magnetic switch device 50 include having the first transistor P1, the first cascode transistor P2, the third transistor P3, and/or the third cascode transistor P4 having a negative polarity (NMOS or NPN), and the second transistor N1, the second cascode transistor N2, the fourth transistor N3, and/or the fourth cascode transistors N4 having a positive polarity (PMOS or PNP). Depending on the transistor type, the first and/or second TMR element 31, 32 can be connected to the positive or negative supply rail.

In an embodiment, the TMR element of the first and/or second TMR element 31, 32, and possibly the first and second setting resistance elements 33, 34, comprise a one or a plurality of tunnel magnetic junctions (MTJs).

Figure 7:
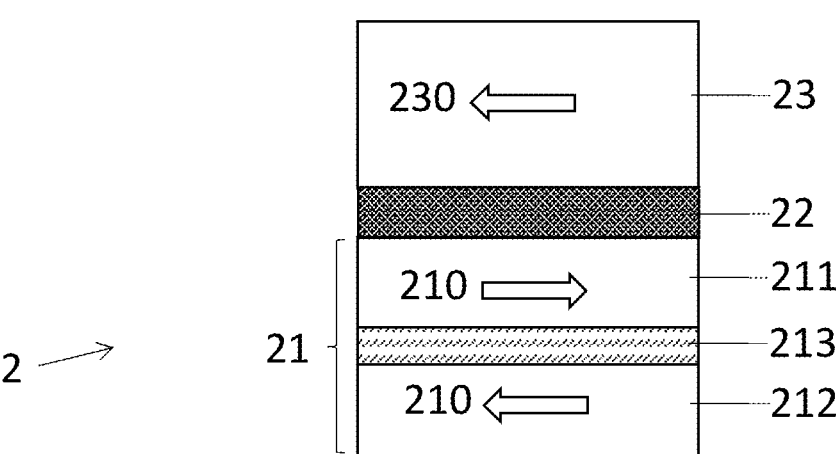
FIG. 7 shows a magnetic tunnel junction comprised in the TMR element, according to an embodiment.

An exemplary MTJ 2 is represented in FIG. 7. The MTJ 2 comprises at least a reference layer 21 having a fixed reference magnetization 210; a ferromagnetic sense layer 23 having a free sense magnetization 210 that is orientable relative to the fixed reference magnetization 210 in the presence of an external magnetic field; and a tunnel barrier layer 22 between the reference layer 21 and the sense layer 23. The sense magnetization 210 comprises a stable vortex configuration of the magnetization in the plane of the sense layer 23, reversibly variable in accordance with the external magnetic field. The sense magnetization 230 has this variable vortex configuration when the external magnetic field

60 is below a vortex nucleation field and, once the vortex configuration is achieved, below a vortex expulsion field.

Each of the reference and sense layers 21, 23 can include, or be formed of, a magnetic material and a magnetic material of the ferromagnetic type. The sense ferromagnetic layer 23 can include a soft ferromagnetic material, namely one having a relatively low coercivity, while the reference ferromagnetic layer 21 can include a hard ferromagnetic material, namely one having a relatively high coercivity. In such manner, a sense magnetization 230 of the sense ferromagnetic layer can be readily varied under low-intensity magnetic fields at which the reference magnetization 210 of the reference layer 21 remains fixed and is used as a reference layer. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B).

The tunnel barrier layer 22 comprises, or is formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm. Large TMR can be obtained for the MTJ 2 comprising a crystalline MgO-based tunnel barrier layer 22.

The MTJ 2 can be optimized for a magnetic switch application. In an embodiment, the "optimized" MTJ 2 can have a resistance value that varies over a wide magnetic field range from 0 to 200 mT. Moreover, The TMR element can have a high magnetoresistance (MR) value, such that the TMR element can advantageously achieve a high signal to noise ratio (SNR) and a high degree of accuracy in the magnetic sensing device 10. Preferably, the MTJ 2 has a magnetoresistance value larger than 100% and preferably larger than 200%. Moreover, the resistance value of the MTJ 2 should be large to reduce the power consumption of the device. For example, the resistance value of the MTJ 2 can be greater than 3 MΩ.

A high MR value can be obtained by the reference layer 21 comprises a synthetic antiferromagnet (SAF) structure. As shown in the example of FIG. 7, the reference layer 21 comprises a SAF structure including a first ferromagnetic reference layer 211 and a second ferromagnetic reference layer 212 that are separated and coupled antiferromagnetically through an intervening non-magnetic layer 213. The non-magnetic layer can be typically a Ru layer but can also comprise any of: Ru, Ir or Cu or a combination of these elements. In an SAF structure, the reference magnetization 210 of the first ferromagnetic layer 211 is coupled substantially antiparallel to the reference magnetization 210 by the non-magnetic layer 213.

For a given lateral size of the MTJ 2, increasing the thickness of the sense layer 23 or increasing the sense magnetization 230, increase the expulsion field of the vortex. The thickness of the sense layer 23 can be between 10 nm and 60 nm, for example about 30 nm. On the other hand, the vortex nucleation field, below which the vortex configuration of magnetization is always formed, should remain positive and as large as possible, such as be greater than 1 mT.

In one aspect, the MTJ 2 comprises a sense layer 21 including, or being formed of, a magnetic material of the ferromagnetic type having a sufficiently low magnetic anisotropy so that in the chosen geometry of the TMR element, the magnetic vortex configuration is formed spontaneously (nucleated) with a nucleation field >1 mT. For example, the sense layer 21 includes, or is formed of, a NiFe-based alloy.

In a preferred embodiment, the lateral size of the magnetic tunnel junction 2, the thickness of the sense layer 23, and the sense magnetization 230 can be chosen such as to result in complete vortex expulsion below an external magnetic field threshold that is equal or below about 20 mT or below about 14 mT.

Preferably, the MTJ 2 has a lateral size larger than 1 $\mu$m. The thickness of the magnetic tunnel junction 2 can be between 30 nm and 80 nm, for example about 50 nm.

Figure 8:
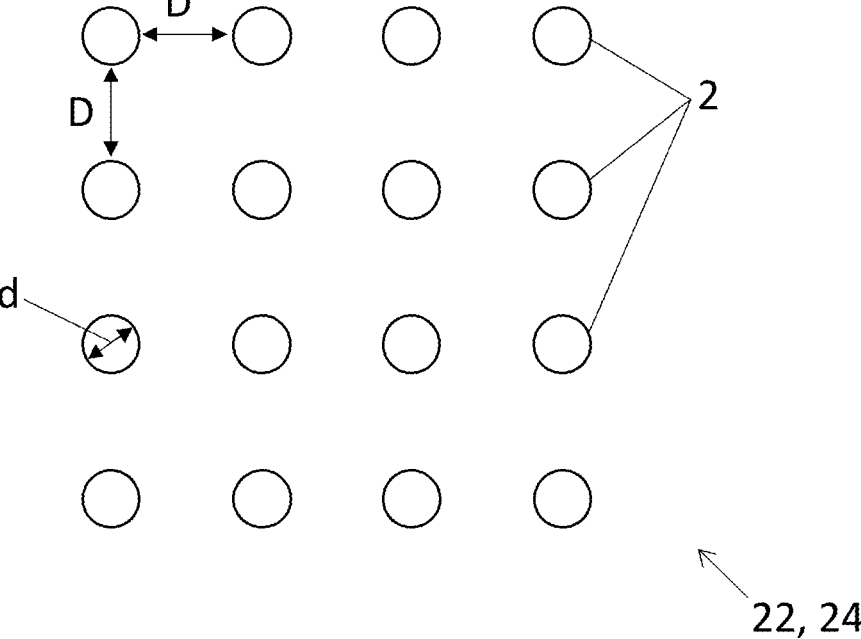
FIG. 8 represents a plurality of magnetic tunnel junctions comprised in the TMR element, according to an embodiment.

The TMR element can comprise one or a plurality of MTJ 2. As illustrated in FIG. 8, the TMR element comprises an array of MTJ 2. In some embodiments, the MTJs 2 in the TMR element can have a maximum vortex nucleation field resulting in a maximum low-field threshold. This can be achieved, for example, by arranging the MTJs 2 in the TMR element such that a distance D between each MTJ 2 is greater than the lateral size d of the MTJ 2. In the specific example of FIG. 8, the MTJs 2 are arranged in a two-dimensional array and the distance D between each MTJ 2 is equal or greater than the lateral size d of each of the MTJs 2.

FIG. 9 reports the TMR resistance $R_{SNS1}$, $R_{SNS2}$ as a function of the magnitude of the external magnetic field for the TMR element 31, 32 comprising a plurality of magnetic tunnel junctions 2. Each MTJ 2 has a lateral size of 4 $\mu$m and the magnetic tunnel junctions 2 are separated by 4 $\mu$m. The ferromagnetic material of the sense layer 23 comprises a NiFe-based alloy. The sense layer 23 has a thickness of 24 nm (curves A) and a thickness of 30 nm (curve B). The response of the TMR element 31, 32 is very close to a magnetic response that is optimal for the magnetic switch application with a high-field threshold in the range 14-20 mT.

Other configurations of the MTJ 2 and/or of the sense layer 23 can be considered (such as different lateral sizes, different arrangements and ferromagnetic material of the sense and reference layers 23, 21), depending on specific field-response threshold requirements of the application.

FIG. 10a reports the TMR resistance $R_{SNS1}$, $R_{SNS2}$ for the TMR element 31, 32 (curve A) and the adjustable resistance $R_{SET1}$, $R_{SET2}$ for the setting resistance element 33, 34 (curve B), as a function of the magnitude of the external magnetic field. Since the sense magnetization 230 of the TMR element 31, 32 comprises a vortex state, the TMR resistance $R_{SNS1}$, $R_{SNS2}$ increases with the external magnetic field H until the vortex expulsion field $H_{expl}$ is reached. The sense magnetization 230 recovers the vortex state when the external magnetic field H is decreased below the nucleation field $H_{nucl}$.

The TMR element 31, 32 comprising at least one MTJ2 can thus have a narrow linear region. In other words, the complete vortex expulsion occurs below a field threshold that is equal to or below about 20 mT or below about 14 mT. For a magnitude of the external magnetic field above the field threshold the sense magnetization 230 of the TMR element 31, 32 is saturated. The nucleation field $H_{nucl}$ can be lower than 10 mT, for example, lower than 5 mT or 2 mT. A larger nucleation field, which is always lower than the expulsion field, is advantageous so that the vortex state is easily recovered when the external field is reduced below the high-field threshold field.

It is understood that the present invention is not limited to the exemplary embodiments described above and other examples of implementations are also possible within the scope of the patent claims.

For example, the TMR element 31, 32 can comprise at least one MTJ 2, wherein the sense layer 23 of the MTJ 2 does not comprise a vortex configuration, in other words, wherein the MTJ 2 does not operate in a "vortex mode". For instance, the MTJ 2 can be operated in a spin-valve mode, with a specific sensitivity axis of the sense layer 23. The sense layer 23 can comprise a single ferromagnetic layer, an unpinned antiferromagnetic-coupled bilayer, trilayer, or multilayer. In that case the sensitivity axis is given by the axis of the reference layer magnetization, and the low-field and high-field thresholds by magnetic field biasing of the sense layer magnetization. This magnetic field biasing can be produced by a permanent magnet, from fringing fields from the reference layer or SAF, or from antiferromagnetic pinning. In another embodiment, the MTJ2 can be operated as a simple magnetic bilayer separated but a tunnel barrier. In that case the reference layer and sense layers are both unpinned, and in zero field are substantially antiparallel to each other due to their mutual magnetic fringing fields. In that case, the sensitivity axis is anywhere in the plane of the layers. In each case, the desired behavior is the achieve a reproducible magnetic configuration with a low corresponding electrical resistance below a low-field threshold, and to achieve another reproducible magnetic threshold with a high corresponding electrical resistance above a high-field threshold.

FIG. 10b shows the variation of the output voltage $V_{cmp}$ of the magnetic switch device as a function of the external magnetic field. While the TMR resistance $R_{SNS1}$, $R_{SNS2}$ of the TMR element 31, 32 varies with the external magnetic field, the adjustable resistance $R_{SET1}$, $R_{SET2}$ for the setting resistance element 33, 34 is substantially constant. When the TMR resistance $R_{SNS1}$, $R_{SNS2}$ of the TMR element 31, 32 is higher than the adjustable resistance $R_{SET1}$, $R_{SET2}$ of the setting resistance element 33, 34, the output voltage $V_{cmp}$ of the magnetic switch device 50 is 0 V. When the TMR resistance $R_{SNS1}$, $R_{SNS2}$ of the TMR element 31, 32 is lower than the adjustable resistance $R_{SET1}$, $R_{SET2}$ of the setting resistance element 33, 34, the output voltage $V_{cmp}$ of the magnetic switch device 50 corresponds to the supply rail, or bias voltage $V_{DD}$.

In one aspect illustrated in FIG. 11, the first and/or second setting resistance element 33, 34 comprise a plurality of poly fuses 310 connected in parallel with a plurality of resistance segments 320. The first and/or second setting resistance element 33, 34 can be programmed to adjust/set the first and/or second adjustable resistances $R_{SET1}$, $R_{SET2}$ to a predetermined resistance value by blowing/trimming any one of the poly fuses 310. The poly fuses 310 can be blown, for example, by applying a waveform to dedicated trim pads 330. The first and/or second setting resistance element 33, 34 can be programmed during production of the magnetic switch device 50, e.g., during wafer sorting, or at any other suitable fabrication step of the magnetic switch device 50.

In some aspects, the first and/or second setting resistance element 33, 34 comprise at least two different types of resistors. For example, the at least two different types of resistors can comprise a combination of a p-type polysilicon resistor and an n-type polysilicon resistor. The first and/or second setting resistance element 33, 34 can be configured to have substantially the same temperature coefficient of resistance (TCR) as the TCR of the first and/or second TMR elements 31, 32. For instance, the first and/or second setting resistance element 33, 34 can be configured to have a TCR of about −600 ppm/° C., corresponding to the TCR of the first and/or second TMR elements 31, 32.

In some aspects, The first and/or second setting resistance element 33, 34 can be programmed to adjust/set the first and/or second adjustable resistances R$_{SET1}$, R$_{SET2}$ to a pre-determined resistance value that is substantially equal to the TMR resistance R$_{SNS1}$, R$_{SNS2}$ of the first and/or second TMR elements 31, 32.

The present disclosure further pertains to a magnetic switch device comprising the magnetic sensing device.

FIG. 12 schematically illustrates a magnetic switch device 50 comprising the magnetic sensing device 10. The current delta Δi$_{SNS}$ of the magnetic sensing device 10 varies in response to a variation of a movement of a target 60 generating the external magnetic field. The target 60 may include a magnet (e.g., permanent magnet, electromagnet, etc.) capable of generating a magnetic field or various types of ferromagnetic material capable of affecting a magnetic field. The magnetic switch device 50 is configured to detect the proximity and/or angle of the external magnetic field associated with target 60. As the target 60 moves closer to the magnetic sensing device 10 or into a particular angle with respect to the magnetic sensing device 10 (arrow B in FIG. 12), a strength of the external magnetic field can increase, and a corresponding current delta Δ$_{iSNS}$ generated by the magnetic sensing device 10 can increase.

The target can move towards and away from the magnetic sensing device 10 along an axis 61 (arrow A in FIG. 12). The target can further slide-by the magnetic sensing device 10 substantially perpendicular to the axis 61 (arrow B in FIG. 12). In any case, the magnetic sensing device 10 can be configured to sense a variety of different types of motions (e.g., head-on, slide-by, rotation, etc.) to detect a distance and/or angle of target 60 relative to the magnetic sensing device 10. The magnetic sensing device 10 can be configured to sense multiple axes of motion and/or alternative axes of motion. The magnetic sensing device 10 can be configured to perform two-dimensional sensing and/or three-dimensional sensing to detect the proximity of one or more targets 61 with respect to the magnetic sensing device 10.

The magnetic switch device 50 can be used to detect proximity of a target 60 to one or more magnetic sensing device 10, where both the target and the magnetic sensing device 10 are capable of motion relative to one another. Example of the magnetic switch device 50 may include a stationary portion to which the magnetic sensing device 10 is attached and a movable portion including a magnet, such as cellular telephones and laptop computers having magnets in moveable door or cover portions. In other examples, the current delta Δi$_{SNS}$ from the magnetic sensing device 10 can be used to determine if a pushbutton or other type of switch associated with the target 60 is open or closed.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

| Reference numbers and symbols | |
| --- | --- |
| 10 | magnetic sensing device |
| 110 | first branch |
| 120 | second branch |
| 2 | magnetic tunnel junction |
| 21 | reference layer |
| 210 | reference magnetization |
| 211 | first ferromagnetic reference layer |
| 212 | second ferromagnetic reference layer |
| 213 | non-magnetic layer |
| 22 | tunnel barrier layer |
| 23 | sense layer |
| 230 | sense magnetization |
| 31 | TMR element, first TMR element |
| 310 | poly fuse |
| 32 | second TMR element |
| 320 | resistance segment |
| 33 | first setting resistance element |
| 330 | trim pad |
| 34 | second setting resistance element |
| 40 | first power supply rail |
| 50 | magnetic switch device |
| 60 | target |
| 61 | axis |
| Δh | field strength delta |
| Δi$_{SNS}$ | current delta |
| ΔR$_{SNS}$ | resistance delta |
| d | lateral size |
| D | distance |
| H$_0$ | field strength reference value |
| i$_{SET}$ | setting current |
| i$_{SNS1}$0 | first reference current value |
| i$_{SNS1}$ | first current |
| i$_{SNS2}$ | second current |
| P1 | first transistor |
| P2 | first cascode transistor |
| P3 | third transistor |
| P4 | third cascode transistor |
| N1 | second transistor |
| N2 | second cascode transistor |
| N3 | fourth transistor |
| N4 | fourth cascode transistor |
| r$_{cmp}$ | equivalent output impedance |
| R$_{SET1}$ | first adjustable resistance |
| R$_{SET2}$ | second adjustable resistance |
| R$_{SNS1}$0 | first TMR reference resistance value |
| R$_{SNS1}$ | first TMR resistance |
| R$_{SNS2}$0 | second TMR reference resistance value |
| R$_{SNS2}$ | second TMR resistance |
| V$_{cmp}$ | node voltage |
| V$_{PBIAS1}$ | first bias voltage |
| V$_{PBIAS2}$ | first cascode bias voltage |
| V$_{NBIAS1}$ | second bias voltage |
| V$_{NBIAS2}$ | second cascode bias voltage |
| V$_{DD}$ | bias voltage |
| V$_{out}$ | output voltage |

What is claimed is:

1. A magnetic sensing device configured to be integrated in a magnetic switch device, the magnetic sensing device comprising:

at least one tunnel magnetoresistive (TMR) element having a TMR resistance that varies with an external magnetic field;

said at least one TMR element being coupled to a first power supply rail providing a supply voltage substantially independent of the external magnetic field;

said at least one TMR element being further coupled to a third terminal of a first transistor, the first transistor being biased at a first terminal by a first bias voltage;

wherein, at a reference field strength of the external magnetic field, the TMR resistance has a TMR reference resistance value, and the first bias voltage is adjustable to control a first current at a second terminal of the first transistor at a first reference current value; and wherein said at least one TMR element is configured such that, when the external magnetic field is varied around the reference field strength by a field strength delta, the TMR resistance varies around the TMR reference resistance value by a resistance delta, such that the first current modulates around the first reference current value by a current delta, wherein the at least one TMR element and the transistor are configured for a sensitivity of the at least one TMR element to correspond to a ratio of the resistance delta and the field strength delta.

2. A magnetic switch device configured to generate two distinct logic levels in response to a sensed magnetic field strength of an external magnetic field, the magnetic switch device comprising:

at least one TMR element having a TMR resistance that varies with the external magnetic field;

said at least one TMR element being coupled to a first power supply rail providing a supply voltage substantially independent of the external magnetic field;

said at least one TMR element being further coupled to a third terminal of a first transistor, the first transistor being biased at a first terminal by a first bias voltage;

wherein, at a reference field strength of the external magnetic field, the TMR resistance has a TMR reference resistance value, and the first bias voltage is adjustable to control a first current at a second terminal of the first transistor at a first reference current value; and wherein said at least one TMR element is configured such that, when the external magnetic field is varied around the reference field strength by a field strength delta, the TMR resistance varies around the TMR reference resistance value by a resistance delta, such that the first current modulates around the first reference current value by a current delta;

wherein the magnetic switch device further comprises a second transistor biased at a first terminal of the second transistor by a second bias voltage, a second terminal of the second transistor being connected to the second terminal of the first transistor at a node; and wherein the second bias voltage is adjustable to control a second current at the second terminal of the second transistor such that the second current is substantially equal to the first reference current value of the first transistor, wherein a polarity of the field strength delta determines which one of the two distinct logic levels is generated by the magnetic switch device.

3. The magnetic switch device according to claim 2, wherein said at least one TMR element comprises a first TMR element, having a first TMR resistance and coupled to a third terminal of the first transistor and to a first power supply rail;

wherein, at a reference field strength of the external magnetic field, the first TMR resistance has a first TMR reference resistance value wherein the first TMR element is configured such that, when the external magnetic field is varied around the reference field strength, the first TMR resistance varies around the first TMR reference resistance value by a resistance delta, such that the first current modulates around the first reference current value by a current delta.

4. The magnetic switch device according to claim 3, said at least one TMR element further comprises a second TMR element connected to the second transistor;

wherein the second TMR element has a second TMR resistance that varies with the external magnetic field;

wherein, at the reference field strength of the external magnetic field, the second TMR resistance has a second TMR reference resistance value, and the second bias voltage is adjustable to control the second current at the second terminal of the second transistor at a second reference current value; and wherein the second TMR element is configured such that, when the external magnetic field is varied around the reference field strength, the second TMR resistance varies around the second TMR reference resistance value by a second resistance delta, such that the second current is modulated around the second reference current value by a current delta.

5. The magnetic switch device according to claim 4, wherein the first and second TMR elements are configured to be sensitive to the external magnetic field in opposite directions, such that, when the external magnetic field varies around the field strength reference value, the second TMR resistance is configured to vary around the second TMR reference resistance value by a second resistance delta having a polarity opposed to the one of the first resistance delta; and wherein an output voltage at the node is substantially equal to twice the value of the current delta multiplied by an equivalent output impedance at the node.

6. The magnetic switch device according to claim 3, further comprises a first cascode transistor, connected to the first transistor and biased by a first cascode bias voltage; and a second cascode transistor, connected to the second transistor and biased by a second cascode bias voltage.

7. The magnetic switch device according to claim 6, further comprising at least one setting resistance element having an adjustable resistance.

8. The magnetic switch device according to claim 7, wherein said at least one setting resistance element comprises a first setting resistance element having an adjustable resistance;

wherein the first setting resistance element is connected to a third transistor and a third cascode transistor;

wherein the third cascode transistor is connected to a fourth cascode transistor and a fourth transistor;

wherein the first and third transistors are biased by the first bias voltage, and the first and third cascode transistors are biased by the first cascode bias voltage;

wherein the second and fourth cascode transistors are biased by the second cascode bias voltage, and the second and fourth transistors are biased by the second bias voltage.

9. The magnetic switch device according to claim 8, wherein the first setting resistance element is configured such that its resistance value matches the first TMR resistance value of the first TMR element, and such that the second current controlled by the second transistor and of the second cascode transistor is substantially equal to the first current controlled by the first transistor and of the first cascode transistor.

10. The magnetic switch device according to claim 8, further comprising a second setting resistance element comprising an adjustable resistance, the second setting resistance element being connected the second transistor; and a second TMR element connected to the fourth transistor, the second TMR element having a second TMR resistance that varies with the external magnetic field.

11. The magnetic switch device according to claim 10, wherein the first and second setting resistance elements are configured such that the first and second adjustable resistances have substantially the same value.

12. The magnetic switch device according to claim 7, wherein said at least one setting resistance element comprises a plurality of poly fuses connected in parallel with a plurality of resistance segments, the setting resistance element being programmable to adjust the adjustable setting resistances to a predetermined resistance value by trimming any one of the poly fuses.

13. The magnetic switch device according to claim 12, wherein said at least one setting resistance element comprises a combination of at least two different types of resistors, configured to have substantially the same temperature coefficient of resistance (TCR) as the TCR of the TMR element.

14. The magnetic switch device according to claim 2, wherein, when the external magnetic field is varied around the field strength reference value, an output voltage at the node is substantially equal to the first current delta multiplied by an equivalent output impedance at the node.

15. The magnetic switch device according to claim 2, wherein said at least one TMR element comprises at least a magnetic tunnel junction including a reference layer having a fixed reference magnetization; a ferromagnetic sense layer having a free sense magnetization that is orientable relative to the fixed reference magnetization in the presence of an external magnetic field; and a tunnel barrier layer between the reference layer and the sense layer; and wherein the reference layer comprises a synthetic antiferromagnet structure.

16. The magnetic switch device according to claim 15, wherein said at least one TMR element has a magnetoresistance value larger than 100%.

17. The magnetic switch device according to claim 15, wherein the sense layer is configured to have a vortex configuration of magnetization and to have complete vortex expulsion at a magnetic field that is below 20 mT, notably below 14 mT.

18. The magnetic switch device according to claim 15, wherein the sense layer has a magnetic anisotropy so that the vortex configuration is spontaneously achieved below a positive field threshold.

19. The magnetic switch device according to claim 15, wherein said at least one TMR element comprises a plurality of magnetic tunnel junctions; and wherein a distance between each magnetic tunnel junction is greater than the lateral size of the magnetic tunnel junction.

20. The magnetic switch device according to claim 15, wherein the magnetic tunnel junction has a lateral size larger than 1 μm; and wherein the thickness of the magnetic tunnel junction is 30 nm and 80 nm.

* * * * *